(12) United States Patent
Meng (10) Patent No.: US 12,103,158 B2
(45) Date of Patent: Oct. 1, 2024

(54) MAGNETIC LEVITATION GRAVITY COMPENSATION DEVICE

(71) Applicant: YinGuan Semiconductor Technology Co., LTD., Shanghai (CN)

(72) Inventor: Hui Meng, Shanghai (CN)

(73) Assignee: YinGuan Semiconductor Technology Co., LTD., Shanghai (CN)

(*) Notice: Subject to any disclaimer, the term of this patent is extended or adjusted under 35 U.S.C. 154(b) by 380 days.

(21) Appl. No.: 17/607,388

(22) PCT Filed: Apr. 23, 2020

(86) PCT No.: PCT/CN2020/086358
§ 371 (c)(1),
(2) Date: Oct. 28, 2021

(87) PCT Pub. No.: WO2020/221094
PCT Pub. Date: Nov. 5, 2020

(65) Prior Publication Data
US 2022/0224256 A1    Jul. 14, 2022

(30) Foreign Application Priority Data

Apr. 30, 2019 (CN) .......................... 201910363230.7
Jul. 12, 2019 (CN) .......................... 201910628291.1

(51) Int. Cl.
*H02N 15/00* (2006.01)
*B25H 1/00* (2006.01)
(Continued)

(52) U.S. Cl.
CPC ......... *B25H 1/005* (2013.01); *F16C 32/0408* (2013.01); *G03F 7/70816* (2013.01);
(Continued)

(58) Field of Classification Search
CPC ...................................................... H02N 15/00
(Continued)

(56) References Cited

U.S. PATENT DOCUMENTS

| 2,747,944 A | 5/1956 | Baermann |
| 9,245,679 B1* | 1/2016 | Termain ............. A47G 23/0241 |

(Continued)

FOREIGN PATENT DOCUMENTS

| CN | 102185541 A | 9/2011 |
| CN | 102215019 A | 10/2011 |

(Continued)

OTHER PUBLICATIONS

European Search Report for corresponding application 20799168.8 Report dated May 2, 2023.

*Primary Examiner* — Daniel C Puentes
*Assistant Examiner* — Masoud Vaziri
(74) *Attorney, Agent, or Firm* — Samson G. Yu (57) ABSTRACT

The disclose provides a magnetic levitation gravity compensation device, including: a first permanent magnet, which is cylindrical; a second permanent magnet, which is cylindrical, arranged in the first permanent magnet and radially spaced from the first permanent magnet; and at least one end permanent magnet, which is cylindrical, and is located on at least one of two axial ends of the second permanent magnet and axially spaced from the two axial ends of the second permanent magnet, a center line of the end permanent magnet is configured to coincide with a center line of the second permanent magnet, and a cylinder wall thickness of the end permanent magnet is smaller than that of the second permanent magnet, wherein a magnetization direction of the first permanent magnet is a radial direction, and a magnetization direction of the second permanent magnet and the end permanent magnet is an axial direction.

10 Claims, 6 Drawing Sheets

(51) Int. Cl.
*F16C 32/04* (2006.01)
*G03F 7/00* (2006.01)

(52) U.S. Cl.
CPC ...... *F16C 2300/34* (2013.01); *G03F 7/70716* (2013.01); *H02N 15/00* (2013.01)

(58) Field of Classification Search
USPC ...................................................... 310/12.06
See application file for complete search history.

(56) References Cited

U.S. PATENT DOCUMENTS

| | | | | |
|---|---|---|---|---|
| 10,125,814 B2* | 11/2018 | Walsh | ................. | F16C 32/0408 |
| 2011/0057755 A1* | 3/2011 | Dams | ................. | G03F 7/70758 |
| | | | | 335/289 |
| 2013/0076467 A1* | 3/2013 | Compter | ............. | F16C 32/0434 |
| | | | | 335/285 |
| 2014/0035411 A1* | 2/2014 | Kundel | ............... | F16C 32/0427 |
| | | | | 310/90.5 |
| 2015/0212430 A1* | 7/2015 | Boon | .................... | H01F 7/0252 |
| | | | | 355/72 |
| 2016/0216611 A1* | 7/2016 | Nefzi | .................... | H02N 15/00 |
| 2018/0315532 A1 | 11/2018 | Hoyer | | |

FOREIGN PATENT DOCUMENTS

| | | |
|---|---|---|
| CN | 103470631 A | 12/2013 |
| CN | 104471485 A | 3/2015 |
| CN | 105988304 A | 10/2016 |
| CN | 106997155 A | 8/2017 |
| CN | 107387631 A | 11/2017 |
| CN | 107885039 A | 4/2018 |
| CN | 109039004 A | 12/2018 |
| CN | 109120185 A | 1/2019 |
| CN | 110153971 A | 8/2019 |
| CN | 210819425 U | 6/2020 |
| DE | 102011004607 A1 | 1/2012 |
| DE | 202017004177 U1 | 11/2017 |
| JP | S61258345 A | 11/1986 |
| JP | 2004039949 A | 2/2004 |
| JP | 2015526055 A | 9/2015 |
| JP | 2016157103 A | 9/2016 |
| KR | 20150036516 A | 4/2015 |

* cited by examiner

MAGNETIC LEVITATION GRAVITY COMPENSATION DEVICE

CROSS-REFERENCE TO RELATED APPLICATION

The disclosure claims the priority of Chinese Patent Present invention No. 201910363230.7, filed on Apr. 30, 2019 and entitled "Magnetic Levitation Gravity Compensation Device", and the priority of Chinese Patent Present invention No. 201910628291.1, filed on Jul. 12, 2019 and entitled "Magnetic Levitation Gravity Compensation Device", which are incorporated herein in their entirety by reference.

TECHNICAL FIELD

The disclosure relates to the technical field of integrated circuit equipment manufacturing, and particularly relates to a long-stroke magnetic levitation gravity compensation device.

BACKGROUND

In recent years, as higher integration of large-scale integrated circuit devices demands higher precision of a workbench, especially motion precision of its vertical module, a motion stroke is increased year over year with the increasing demand of the workbench, such as lithographic equipment, film thickness detection equipment, etc. Thus, a vertical gravity compensation technology is also constantly updated iteratively. At present, three solutions are widely used in a gravity compensation device: a mechanical spring, an air flotation device and a magnetic levitation gravity compensation device.

U.S. Pat. No. 6,337,484B1 uses the air flotation device to compensate for gravity, and controls an air flow in a constant pressure chamber to be constant so as to output stable air buoyancy. However, it is difficult to design and manufacture the air flotation device. In addition, the air flow in the constant pressure chamber is required to keep stable at all times because system disorder will be caused once the air flow fluctuates.

An adjustable magnetic levitation gravity compensation device provided in CN201510091980.5 and CN201110299070.8 makes a magnetic field distributed more uniformly by changing strength of a mover magnetic field, and then outputs a magnetic levitation force with small fluctuation. However, these methods not only have complex magnetic circuit structures, but also have large fluctuation in output magnetic levitation force and a small vertical stroke of a mover. Moreover, a stroke of a mover in the patent is only ±2 mm, which is far from the application requirements.

Thus, a novel magnetic levitation gravity compensation device is needed urgently, which may overcome defects of a traditional magnetic levitation gravity compensation device, such as a short stroke and a complex structure, and may generate the magnetic levitation force with small fluctuation and high amplitude.

SUMMARY

The object of the disclosure is to provide a magnetic levitation gravity compensation device, which is long in stroke, simple in structure, high in amplitude of magnetic levitation force and small in fluctuation.

In order to achieve the above object, the disclosure provides a magnetic levitation gravity compensation device, the magnetic levitation gravity compensation device includes:
  a first permanent magnet, the first permanent magnet is cylindrical;
  a second permanent magnet, the second permanent magnet is cylindrical, and is arranged in the first permanent magnet and radially spaced from the first permanent magnet; and
  at least one end permanent magnet, the at least one end permanent magnet is cylindrical, and is located on at least one of two axial ends of the second permanent magnet and axially spaced from the two axial ends of the second permanent magnet, a center line of the end permanent magnet is configured to coincide with a center line of the second permanent magnet, and a cylinder wall thickness of the end permanent magnet is smaller than a cylinder wall thickness of the second permanent magnet,
  wherein a magnetization direction of the first permanent magnet is a radial direction, and a magnetization direction of the second permanent magnet and the end permanent magnet is an axial direction.

In an implementation mode, the magnetic levitation gravity compensation device includes: a first supporting member, the first supporting member is used for fixing the first permanent magnet; and a second supporting member, the second supporting member is used for fixing the second permanent magnet and the end permanent magnet, where the first supporting member and the second supporting member may axially move relative to each other.

In an implementation mode, the first supporting member is cylindrical, and the first permanent magnet is embedded in an inner peripheral surface of the first supporting member.

In an implementation mode, the second supporting member is columnar, and the second permanent magnet and the end permanent magnet are embedded in an outer peripheral surface of the second supporting member.

In an implementation mode, a spacing distance between the second permanent magnet and the end permanent magnet is 0.1 mm to 1.0 mm.

In an implementation mode, the first permanent magnet consists of an even number of radial permanent magnet blocks which are radially spaced from each other, and a pole-arc coefficient of single radial permanent magnet block ranges from 0.75 to 0.98.

In an implementation mode, each of two ends of the second permanent magnet is provided with one end permanent magnet.

In an implementation mode, at least one end of the second permanent magnet is provided with two or more end permanent magnets.

In an implementation mode, an inner diameter of the end permanent magnet is not smaller than an inner diameter of the second permanent magnet, and an outer diameter of the end permanent magnet is not larger than an outer diameter of the second permanent magnet.

In an implementation mode, lengths of the first permanent magnet, the second permanent magnet and the end permanent magnet are La, Lb and Lc respectively, where Lb>Lc.

In an implementation mode, an inner diameter of the second permanent magnet and an inner diameter of the end permanent magnet are Db and Dc respectively, and $\gamma1=Db/Dc$, and $\gamma1$ ranges from $\frac{1}{8}$ to 1.

In an implementation mode, a stroke of the first supporting member and the second supporting member axially moving relative to each other is S, λ1=La/Lb, λ2=Lc/Lb, and λ1 ranges from ¼ to 1+2λ2-2S/Lb.

In an implementation mode, a stroke of the first supporting member and the second supporting member axially moving relative to each other is S, λ2=Lc/Lb, and λ2 ranges from ¼ to ⅜.

In an implementation mode, a spacing distance between the first permanent magnet and the second permanent magnet is Rg, and Rg is not smaller than ten times a spacing distance between the second permanent magnet and the end permanent magnet.

The disclosure further provides a workbench, the workbench includes a workbench body, wherein a cavity is provided below the workbench body, and is used for accommodating the above magnetic levitation gravity compensation device.

In an implementation mode, the number of the cavities is three or four.

Compared with a magnetic levitation gravity compensation device in the related art, the magnetic levitation gravity compensation device of the disclosure may provide a high-amplitude magnetic levitation force, with small fluctuation of a magnetic levitation force in a long stroke.

DETAILED DESCRIPTION OF THE EMBODIMENTS

The exemplary embodiments of the disclosure are described in detail below in conjunction with the accompanying drawings so as to better describe objects, features and advantages of the disclosure. It should be understood that the embodiments shown in the accompanying drawings are not to limit the scope of the disclosure, but only to describe the spirit of the technical solution of the disclosure.

In the following description, in order to describe various disclosed embodiments, certain specific details are set forth to provide a thorough understanding of the various disclosed embodiments. However, those skilled in the related art will recognize that embodiments may be implemented without one or more of these specific details. In other cases, well-known devices, structures and techniques associated with the disclosure may not be shown or described in detail to avoid unnecessarily obscuring the description of the embodiments.

Unless the context has other requirements, in the whole specification and claims, the word "including" and its variants, such as "comprising" and "having", should be understood as an open and inclusive meaning, that is, should be interpreted as "including but not limited to."

References to "an embodiment" or "one embodiment" throughout the specification mean that a particular characteristic, structure or feature described in conjunction with an embodiment is included in at least one embodiment. Therefore, "in an embodiment" or "in one embodiment" in various positions throughout the specification need not all refer to the same embodiment. In addition, specific characteristics, structures, or features may be combined in any mode in one or more embodiments.

As used in this specification and the appended claims, the singular forms "a" and "the" include meanings of plural referents unless there are clear and additional stipulations herein. It should be pointed out that the term "or" is usually used in its meaning including "and/or", unless there are clear and additional stipulations herein.

In the following description, in order to clearly show the structure and working mode of the disclosure, many directional words will be used to describe it, but words such as "front", "rear", "left", "right", "outside", "inside", "outward", "inward", "on" and "under" should be understood as convenient words, but should not be understood as limiting words.

It should be noted that relational terms in the claims and specification of the disclosure such as first and second are only used to distinguish one entity or operation from another entity or operation without necessarily requiring or implying any actual relation or order between such entities or operations.

The disclosure aims to overcome defects of a short stroke and a complex structure of a traditional magnetic levitation gravity compensation device, and provides a magnetic levitation gravity compensation device, which has a long stroke so as to provide a high-amplitude magnetic levitation force with small fluctuation, thus being applied to a workbench requiring high-precision vertical movement. With reference to the drawings, a magnetic levitation gravity compensation device according to the disclosure is described below.

Figure 1:
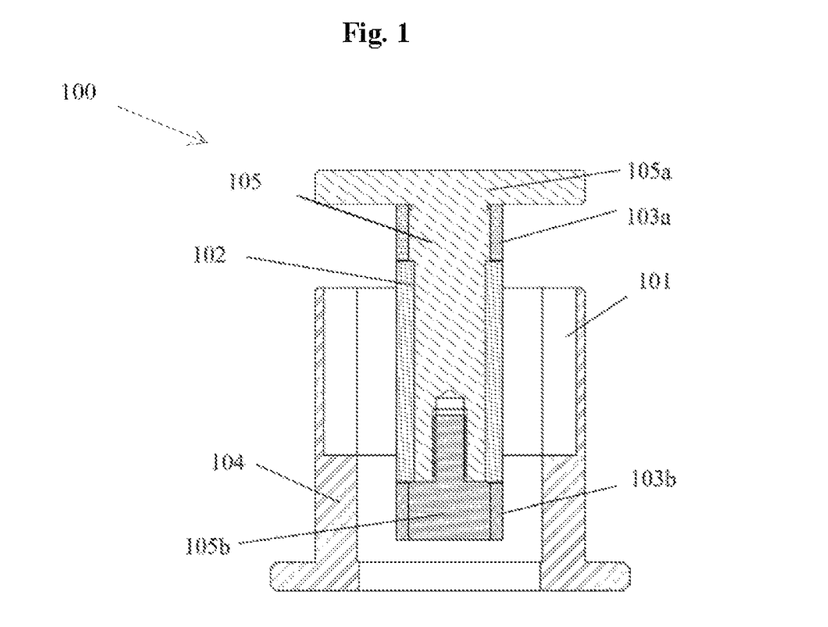
FIG. 1 shows a sectional schematic diagram of a magnetic levitation gravity compensation device according to the disclosure.

FIG. 1 shows sectional schematic diagram of a magnetic levitation gravity compensation device 100 according to the disclosure. As shown in FIG. 1, the device 100 includes: a first permanent magnet 101, a second permanent magnet 102, and end permanent magnets 103a and 103b. Wherein the first permanent magnet 101 is cylindrical, and the second permanent magnet 102 is also cylindrical and sleeved with the first permanent magnet 101 and is radially spaced from the first permanent magnet 101 by a certain distance. Both of the end permanent magnets 103a and 103b are cylindrical and located in two axial ends of the second permanent magnet 102 respectively, and the end permanent magnets 103a and 103b are axially spaced from the two axial ends of the second permanent magnet 102 by a certain distance respectively. By additionally arranging the end permanent magnets 103a and 103b at the two axial ends of the second permanent magnet 102, distribution of a magnetic line of force between the first permanent magnet 101 and the second permanent magnet 102 may be adjusted, so that a magnetic levitation force with small fluctuation in a long stroke of the first permanent magnet 101 and the second permanent magnet 102 axially moving relative to each other is achieved. It should be understood that only one axial end of the second permanent magnet 102 may be provided with the end permanent magnet 103a or 103b without departing from the scope of the disclosure. Center lines of the end permanent magnets 103a and 103b coincide with a center line of the second permanent magnet 102, and cylinder wall thicknesses of the end permanent magnets 103a and 103b are smaller than a cylinder wall thickness of the second permanent magnet 102. Wherein a magnetization direction of the first permanent magnet 101 is a radial direction, and magnetization directions of the second permanent magnet 102 and the end permanent magnets 103a and 103b are an axial direction. The above permanent magnet arrangement and magnetization direction may generate a magnetic levitation force when the first permanent magnet 101 moves relative to the second permanent magnet 102 and the end permanent magnets 103a and 103b.

In order to achieve the above arrangement, a first supporting member and a second supporting member are arranged, wherein the first supporting member is used for fixing the first permanent magnet 101; and the second supporting member is used for fixing the second permanent magnet 102 and the end permanent magnets 103a and 103b, the first supporting member and the second supporting member may be capable of axially moving relative to each other. In practice, one of the first supporting member and the second supporting member is fixed relative to the workbench, while the other one of the first supporting member and the second supporting member is fixed relative to a bracket of the workbench, so that when the workbench is driven by a driving device to move vertically relative to the bracket, a weight of the workbench and a supporting body thereof may be compensated by means of the magnetic levitation force generated between the first permanent magnet 101 and the second permanent magnet 102 as well as the end permanent magnets 103a and 103b, that is, between the first supporting member and the second supporting member, thus achieving more precise control over vertical movement of the workbench. Hereinafter, the disclosure is described by taking as an example that the first supporting member is fixed relative to the bracket of a workbench and the second supporting member is fixed relative to the workbench. It should be understood that an embodiment, in which the second supporting member is fixed relative to the support of the workbench and the first supporting member is fixed relative to the workbench, is also within the scope of the disclosure.

Figure 3:
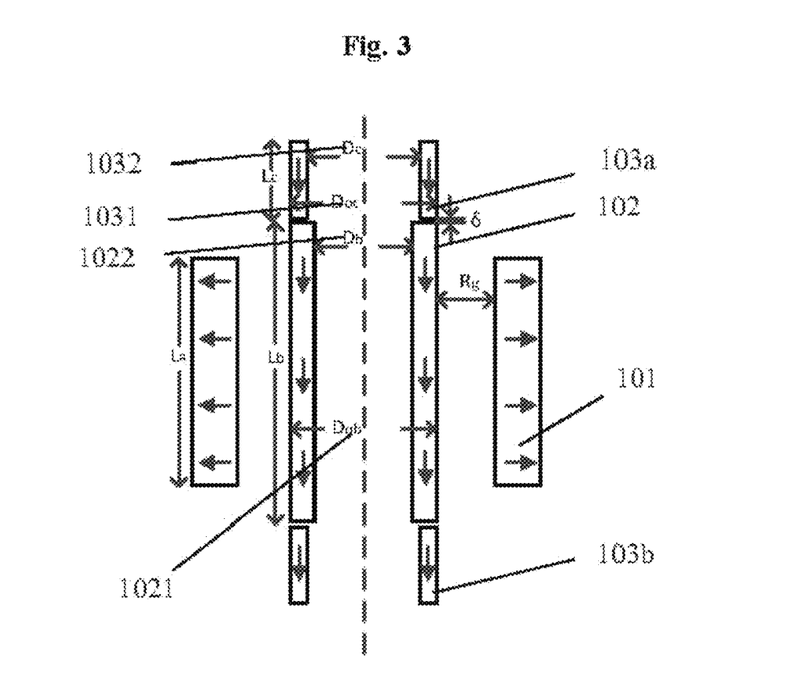
FIG. 3 shows a longitudinal sectional schematic diagram of a magnetization direction and a size of permanent magnet of the magnetic levitation gravity compensation device according to the disclosure.

Hereinafter, for convenience of description, the first permanent magnet 101 is referred to as stator permanent magnet 101 and the second permanent magnet 102 is referred to as mover permanent magnet 102. In an embodiment shown in FIG. 1, the first supporting member is a stator base 104, the second supporting member is a mover shaft 105. The stator base 104 is cylindrical, the stator permanent magnet 101 is embedded in an inner peripheral surface of the stator base 104, and the mover permanent magnet 102 and the end permanent magnets 103a and 103b are embedded in an outer surface of the mover shaft 105, and the stator permanent magnet 101 and the mover permanent magnet 102 are spaced from each other without mechanical connection therebetween. Wherein the mover shaft 105 may be of an integrated structure, or may be assembled from a mover shaft first portion 105a and a mover shaft second portion 105b as shown in FIG. 1, wherein a longitudinal section of the mover shaft first portion 105a is T-shaped, and the mover shaft second portion 105b and the mover shaft first portion 105a are assembled by means of threads. The assembling structure makes it possible to install or remove the end permanent magnet 103b as required, a magnetization direction of the stator permanent magnet 101 is a radial direction, and magnetization directions of the mover permanent magnet 102 and the end permanent magnets 103a and 103b are an axial direction. As shown in FIG. 3, an arrow direction in FIG. 3 represents a magnetization direction of permanent magnet, the magnetization direction of the stator permanent magnet 101 is radially outward, and the magnetization directions of the mover permanent magnet 102 and the end permanent magnets 103a and 103b are consistent and axially downward; and in the same way, accordingly, the magnetization direction of the stator permanent magnet 101 may also be radially inward, while the magnetization directions of the mover permanent magnet 102 and the end permanent magnets 103a and 103b are axially upward.

In addition, a certain spacing distance δ is provided between the mover permanent magnet 102 and the end permanent magnets 103a and 103b, which facilitates adjustment on fixing and assembling of a mover magnetic field and the permanent magnet. Wherein a value of spacing distance δ is selected depending on a stroke, and preferably ranges from 0.1 mm to 1.0 mm in general.

Figure 2:
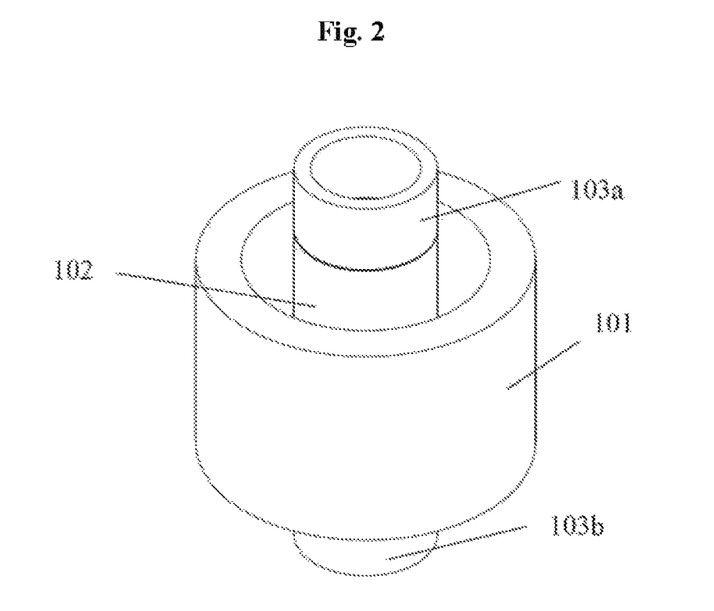
FIG. 2 shows a structural schematic diagram of the magnetic levitation gravity compensation device according to Embodiment 1 of the disclosure.

FIG. 2 shows a structural schematic diagram of Embodiment 1 of the disclosure. In FIG. 2, each of the stator permanent magnet 101, the mover permanent magnet 102 and the end permanent magnets 103a and 103b is of a cylindrical structure, and the end permanent magnets 103a and 103b are equal in shape and size. As shown in FIG. 3, lengths of the stator permanent magnet 101, the mover permanent magnet 102 and the end permanent magnets 103a and 103b are La, Lb and Lc respectively, a mover permanent magnet outer diameter 1021 and an end permanent magnet outer diameter 1031 are represented by Dob and Doc respectively, a mover permanent magnet inner diameter 1022 and an end permanent magnet inner diameter 1032 are represented by Db and Dc respectively, and a unilateral air gap between the stator permanent magnet 101 and the mover permanent magnet 102 is represented by Rg. Axial lengths Lb and Lc of the mover permanent magnet 102 and the end permanent magnets 103a and 103b are unequal, and generally Lb>Lc.

As shown in FIG. 3, radial thicknesses of the end permanent magnets 103a and 103b are smaller than a radial thickness of the mover permanent magnet 102. A radial position relation between the end permanent magnets 103a and 103b and the mover permanent magnet 102 is that outer diameters of the end permanent magnets 103a and 103b may be slightly larger than a outer diameter of the mover permanent magnet 102, while inner diameters of the end permanent magnets 103a and 103b may be slightly smaller than a inner diameter of the mover permanent magnet 102. In an embodiment, the outer diameters of the end permanent magnets 103a and 103b are not larger than the outer diameter of the mover permanent magnet 102, while the inner diameters of the end permanent magnets 103a and 103b are not smaller than the inner diameter of the mover permanent magnet 102.

The radial position relation generally has three solutions: (1) the mover permanent magnet outer diameter 1021 and the end permanent magnet outer diameter 1031 are equal, and the mover permanent magnet inner diameter 1022 and the end permanent magnet inner diameter 1032 are unequal; (2) the mover permanent magnet outer diameter 1021 and the end permanent magnet outer diameter 1031 are unequal, and the mover permanent magnet inner diameter 1022 and the end permanent magnet inner diameter 1032 are equal; (3) the mover permanent magnet outer diameter 1021, the mover permanent magnet inner diameter 1022, the end permanent magnet outer diameter 1031 and the end permanent magnet inner diameter 1032 are unequal, and a distance between the inner diameter of the mover permanent magnet 102 and the inner diameter of the end permanent magnet 103 is equal to a distance between the outer diameter of the mover permanent magnet 102 and the outer diameters of the end permanent magnets 103a and 103b, that is, a cylinder bisecting a cylinder thickness of the mover permanent magnet 102 in a radial direction coincides with a cylinder bisecting a cylinder thickness of the end permanent magnet in a radial direction.

In addition, it should be understood that the end permanent magnets 103a and 103b may also be different from each other, for example, one or more of the outer diameters, the inner diameters, the cylinder thicknesses or heights thereof may be different from each other.

It should be noted that in an embodiment shown in FIG. 3, the mover permanent magnet outer diameter 1021 and the end permanent magnet outer diameter 1031 are equal, while the mover permanent magnet inner diameter 1022 and the end permanent magnet inner diameter 1032 are unequal.

In the embodiment as shown in FIG. 3, three size ratios are defined as $\lambda1=La/Lb$, $\lambda2=Lc/Lb$, $\gamma1=Db/Dc$, which relate to the fluctuation of the magnetic levitation force and also change with a stroke and an amplitude of a magnetic levitation device. Assuming that a total stroke of the magnetic levitation device is S, a value range of $\lambda1$ is preferably [¼, 1+2λ2−2S/Lb] according to the stroke; and a value of $\lambda2$ relates to the number Nt of blocks (as described below) of the end permanent magnet, when Nt=1, a value range of $\lambda2$ is preferably [¼, ⅜]. Generally, a value of $\gamma1$ relates to the fluctuation of the magnetic levitation force, and considering processing difficulty and an assembly process of the permanent magnet, a value range of $\gamma1$ is preferably [⅛, 1]. In addition, the unilateral air gap Rg between the stator permanent magnet 101 and the mover permanent magnet 102 also affects strength of a magnetic field to a certain extent, and further affects an amplitude and fluctuation degree of the magnetic levitation force. Generally, a value of the unilateral air gap Rg varies with the amplitude of the magnetic levitation force, and the value of the unilateral air gap Rg is preferably larger than or equal to 100.

Figure 4:
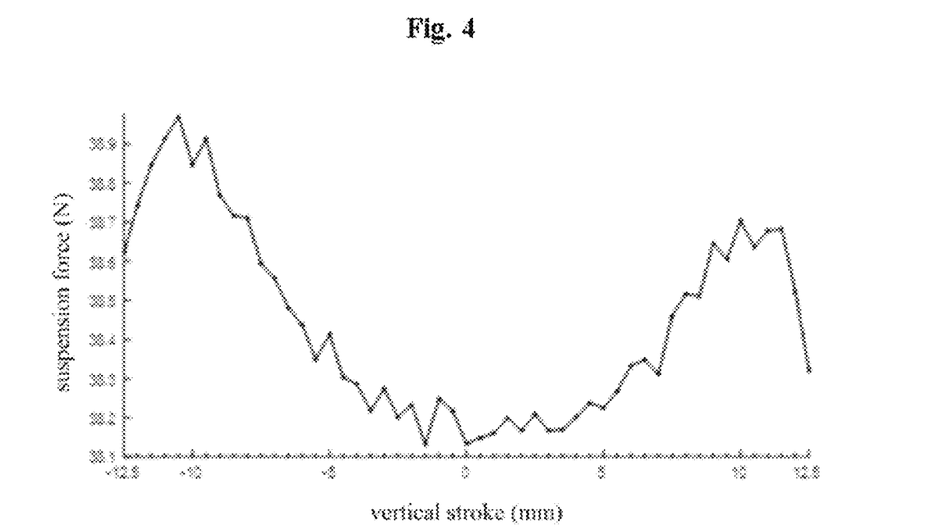
FIG. 4 shows a curve of a magnetic levitation force of the magnetic levitation gravity compensation device according to the disclosure.

According to a distribution track of the magnetic line of force and a principle that like magnetic poles repel each other, it may be inferred that gravity of the mover shaft 105 and a carrier thereof as well as the mover permanent magnet 102 and the end permanent magnets 103a and 103b is compensated by the magnetic levitation force generated by magnetic field interaction among the mover permanent magnet 102, the end permanent magnets 103a and 103b and the stator permanent magnet 101, and radial thrust generated by the stator permanent magnet 101 against the mover permanent magnet 102 and the end permanent magnet 103a and 103b is a group of forces with equal amplitudes and uniformly distributed along a circumference, so the mover shaft 105 may always float in a center of the stator permanent magnet 101 by means of the magnetic levitation force. Through electromagnetic simulation, a curve of the magnetic levitation force generated by interaction between a magnetic field of the mover permanent magnet and a magnetic field of the stator permanent magnet may be obtained. As shown in FIG. 4, an amplitude of the magnetic levitation force in FIG. 4 ranges from 38.13 N to 38.97 N with the small fluctuation of 1.08% in a stroke range of 25 mm, which is basically close to a fluctuation degree of a traditional magnetic levitation gravity compensation device in the stroke range of +2 mm.

Figure 5:
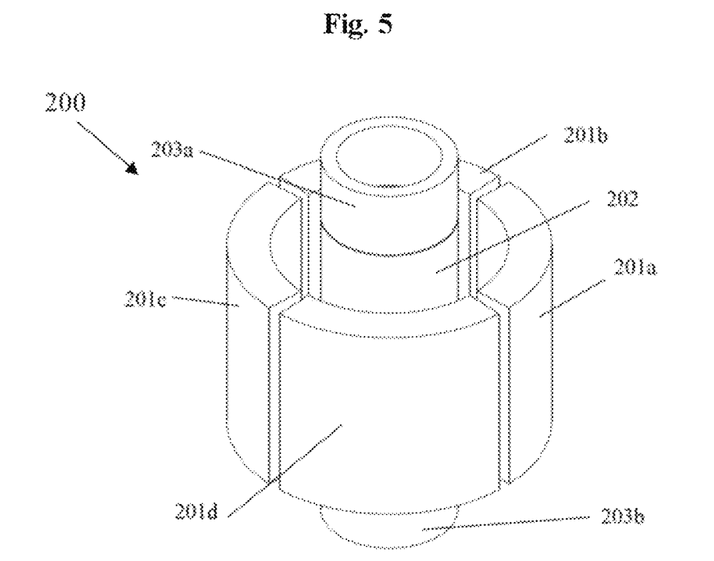
FIG. 5 shows a structural schematic diagram of the magnetic levitation gravity compensation device according to Embodiment 2 of the disclosure.

FIG. 5 shows a structural schematic diagram of the magnetic levitation gravity compensation device 200 according to Embodiment 2 of the disclosure. The magnetic levitation gravity compensation device 200 includes a stator permanent magnet, a mover permanent magnet 202, and end permanent magnets 203a and 203b. The embodiment is basically consistent with Embodiment 1 except that considering magnetization of the stator permanent magnet and difficulty of a processing technology, the stator permanent magnet may be replaced with a group of blocky radially magnetized permanent magnets 201a, 201b, 201c and 201d in a circumferential direction. In order to eliminate a radial unbalanced force in the embodiment, the number N of blocks of the stator permanent magnets is usually even, and N=4 in the embodiment. It should be noted that a value of N is not limited to a value in the embodiment, but may also be extended to other even numbers, such as six and eight, according to the inner and outer diameters of the stator permanent magnet.

An pole-arc coefficient $\alpha$ of the radially magnetized permanent magnets 201a, 201b, 201c and 201d is a ratio of a polar arc length to a polar distance, and experience shows that the pole-arc coefficient $\alpha$ of the stator permanent magnets 201a, 201b, 201c and 201d generally ranges from 0.75 to 1.0, and the pole-arc coefficient $\alpha$ of the stator permanent magnet 201a may be equivalently represented by a pitch angle $\theta$ between the stator permanent magnet 201a and the stator permanent magnet 201b. When N takes different values, a value range of the pitch angle $\theta$ is generally [0°, 30°]. The pole-arc coefficient $\alpha$ of each block of permanent magnets may be adjusted by adjusting the pitch angle $\theta$ of adjacent blocks of permanent magnets in a circumferential direction, so as to increase or decrease a total volume of the stator permanent magnet and adjust the amplitude of the magnetic levitation force.

Figure 6:
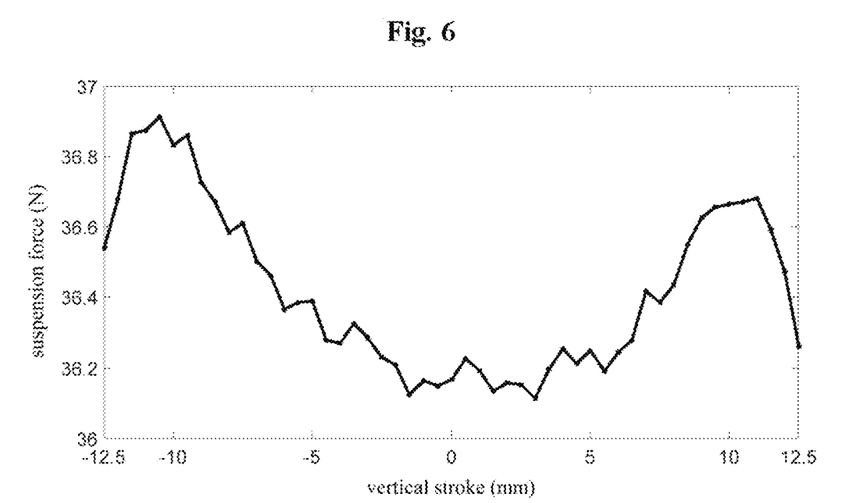
FIG. 6 shows a curve of fluctuation of the magnetic levitation force according to Embodiment 2 of the disclosure.

In the embodiment, considering the amplitude and the fluctuation of the magnetic levitation force comprehensively, a group of optimal topological structures are recommended, wherein the number N of circumferential blocks of the stator permanent magnet is 4, the pitch angle $\theta$ of the permanent magnet is 5°, and the pole-arc coefficient $\alpha$ of the permanent magnet is 17/18. A curve of the fluctuation of the magnetic levitation force obtained through simulation is shown in FIG. 6. It may be seen from FIG. 6 that the amplitude of the magnetic levitation force of Embodiment 2 fluctuates from 36.13 N to 36.91 N in the stroke range, with a very small fluctuation rate of 1.09%.

Figure 7:
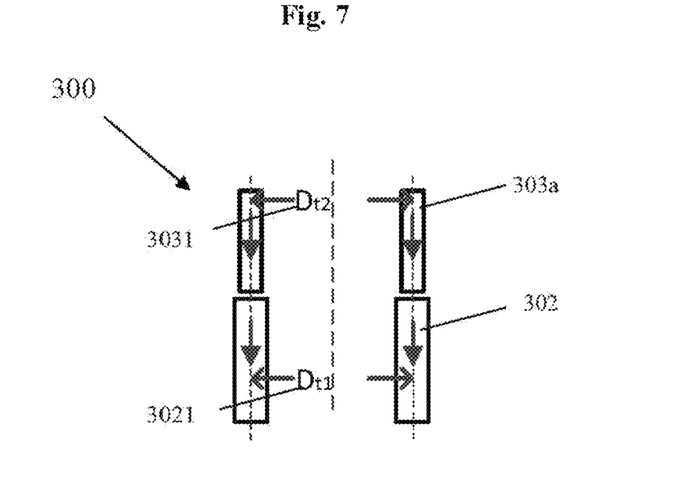
FIG. 7 shows a schematic diagram according to Embodiment 3 of the disclosure, wherein a cylinder bisecting a cylinder thickness of mover permanent magnet in a radial direction coincides with a cylinder bisecting a cylinder thickness of the end permanent magnet in a radial direction.

FIG. 7 shows a structural schematic diagram of the magnetic levitation gravity compensation device 300 according to Embodiment 3 of the disclosure. The magnetic levitation gravity compensation device 300 includes a stator permanent magnet (not shown), a mover permanent magnet 302 and an end permanent magnet 303a. In the embodiment, the cylinder bisecting the cylinder thickness of the mover permanent magnet 302 in the radial direction coincides with the cylinder bisecting the cylinder thickness of the end permanent magnet 303a in the radial direction.

Figure 8:
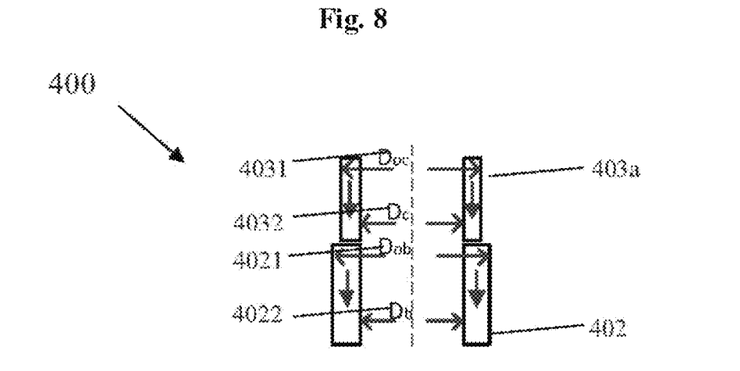
FIG. 8 shows a schematic diagram according to Embodiment 4 of the disclosure, wherein inner diameters of the mover permanent magnet and the end permanent magnet are equal.

FIG. 8 shows a structural schematic diagram of the magnetic levitation gravity compensation device 400 according to Embodiment 4 of the disclosure. The magnetic levitation gravity compensation device 400 includes a stator permanent magnet (not shown), a mover permanent magnet 402 and an end permanent magnet 403a. Wherein an end permanent magnet inner diameter 4032 and a mover permanent magnet inner diameter 4022 are equal, and an end permanent magnet outer diameter 4031 and a mover permanent magnet outer diameter 4021 are unequal.

Figure 9:
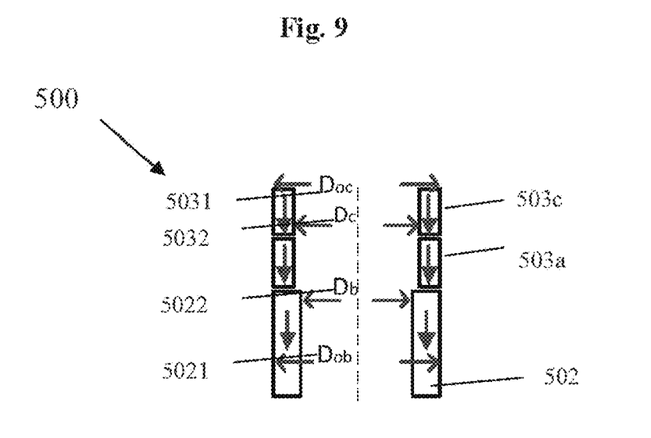
FIG. 9 shows a schematic diagram of the number of the end permanent magnet two according to Embodiment 5 of the disclosure.

FIG. 9 shows a structural schematic diagram of the magnetic levitation gravity compensation device 500 according to Embodiment 5 of the disclosure. The magnetic levitation gravity compensation device 500 includes a stator permanent magnet (not shown), a mover permanent magnet 502, and end permanent magnets 503a and 503c, wherein the end permanent magnet at one axial end of the mover permanent magnet 502 is axially blocky. According to the stroke of the magnetic levitation gravity compensation device and the fluctuation of the magnetic levitation force, the number Nt of unilateral blocks may be adjusted. In the above embodiments, Nt=1, but Nt is not limited to 1, and may also be larger than 1. Generally, the more the number Nt of unilateral blocks of the end permanent magnet, the more uniform distribution of a magnetic field provided by the mover permanent magnet 502 and the end permanent magnet, and the more stable the curve of the magnetic levitation force. In the embodiment, a solution that the number Nt of blocks of the end permanent magnet is 2 is shown. In addition, in the embodiment, an end permanent magnet inner diameter 5032 and a mover permanent magnet inner diameter 5022 are unequal, and an end permanent magnet outer diameter 5031 and a mover permanent magnet outer diameter 5021 are equal. It should be understood that the other axial end of the mover permanent magnet 502 may also be provided with a single block of end permanent magnet or axially blocky end permanent magnet. Other radial position relations between the end permanent magnet and the mover permanent magnet 502 may be used without departing from the scope of the disclosure.

Figure 10:
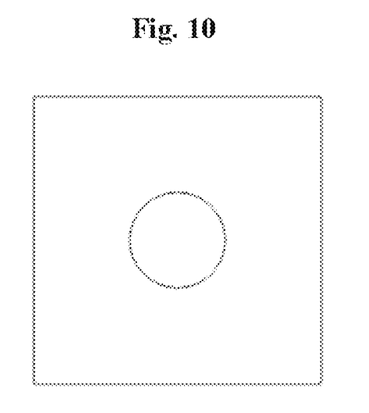
FIG. 10 shows a single-point layout according to Embodiment 6 of the disclosure.
Figure 11:
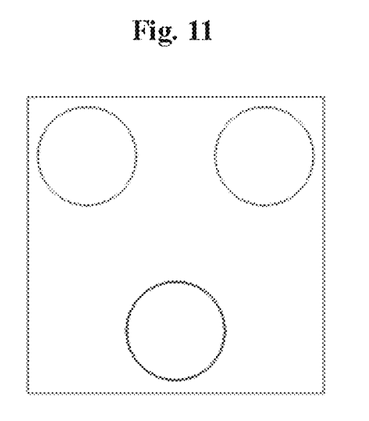
FIG. 11 shows a three-point layout according to Embodiment 6 of the disclosure.
Figure 12:
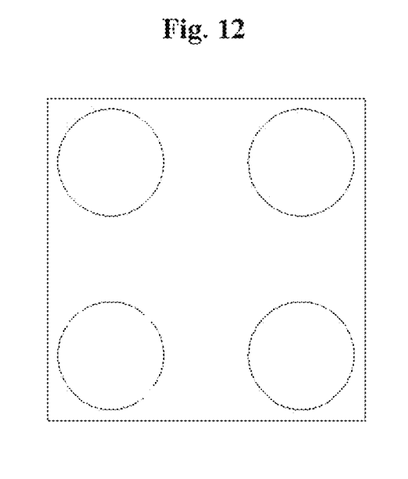
FIG. 12 shows a four-point layout according to Embodiment 6 of the disclosure.

FIGS. 10-12 show a bottom view of a workbench using the magnetic levitation gravity compensation device according to the disclosure. A cavity is provided below the workbench body, and is used for accommodating a magnetic levitation gravity device according to the disclosure. Wherein a number of the cavity below the workbench may be one, as shown in FIG. 10, may also be three for regular triangle arrangement for example to form a three-point layout, and, as shown in FIG. 11, may also be four for square arrangement to form a four-point layout.

The exemplary embodiments of the disclosure have been described in detail above, but it should be understood that aspects of the embodiments may be modified to provide additional embodiments by using aspects, features and concepts of various patents, applications and publications, if necessary.

In view of the above detailed description, these and other changes may be made to the embodiments. Generally speaking, terms used in the claims should not be regarded as limited to the specific embodiments disclosed in the specification and claims, but should be understood as including all possible embodiments together with all the equivalent ranges of these claims.

What is claimed is:

1. A magnetic levitation gravity compensation device, comprising:
  a first permanent magnet, the first permanent magnet is cylindrical;
  a second permanent magnet, the second permanent magnet is cylindrical, and is arranged in the first permanent magnet and radially spaced from the first permanent magnet; and
  at least one end permanent magnet, the at least one end permanent magnet is cylindrical, and is located on at least one of two axial ends of the second permanent magnet and axially spaced from the two axial ends of the second permanent magnet, a center line of the end permanent magnet is configured to coincide with a center line of the second permanent magnet, and a cylinder wall thickness of the end permanent magnet is smaller than a cylinder wall thickness of the second permanent magnet,
  wherein a magnetization direction of the first permanent magnet is a radial direction, and a magnetization direction of the second permanent magnet and the end permanent magnet is an axial direction, and magnetization directions of the second permanent magnet and the end permanent magnet are consistent;
  an inner diameter of the end permanent magnet is not smaller than an inner diameter of the second permanent magnet, and an outer diameter of the end permanent magnet is not larger than an outer diameter of the second permanent magnet;
  an inner diameter of the second permanent magnet and an inner diameter of the end permanent magnet are Db and De respectively, and $\gamma 1 = Db/De$, and $\gamma 1$ ranges from $\frac{1}{8}$ to 1;
  a spacing distance between the second permanent magnet and the end permanent magnet is 0.1 mm to 1.0 mm;
  a first supporting member, the first supporting member is used for fixing the first permanent magnet; and a second supporting member, the second supporting member is used for fixing the second permanent magnet and the end permanent magnet, wherein the first supporting member and the second supporting member may axially move relative to each other;
  lengths of the first permanent magnet, the second permanent magnet and the end permanent magnet are La, Lb and Lc respectively, wherein Lb>Lc;
  a stroke of the first supporting member and the second supporting member axially moving relative to each other is S, $\lambda 1 = La/Lb$, $\lambda 2 = Lc/Lb$, and $\lambda 1$ ranges from $\frac{1}{4}$ to $1 + \lambda 2 \times 2 - 2S/Lb$.

2. The magnetic levitation gravity compensation device according to claim 1, wherein the first supporting member is cylindrical, and the first permanent magnet is embedded in an inner peripheral surface of the first supporting member.

3. The magnetic levitation gravity compensation device according to claim 1, wherein the second supporting member is columnar, and the second permanent magnet and the end permanent magnet are embedded in an outer peripheral surface of the second supporting member.

4. The magnetic levitation gravity compensation device according to claim 1, wherein the first permanent magnet consists of an even number of radial permanent magnet blocks which are radially spaced from each other, and a pole-arc coefficient of single radial permanent magnet block ranges from 0.75 to 0.98.

5. The magnetic levitation gravity compensation device according to claim 1, wherein each of two ends of the second permanent magnet is provided with one end permanent magnet.

6. The magnetic levitation gravity compensation device according to claim 1, wherein at least one end of the second permanent magnet is provided with two or more end permanent magnets.

7. The magnetic levitation gravity compensation device according to claim 1, wherein a stroke of the first supporting member and the second supporting member axially moving relative to each other is S, $\lambda 2 = Lc/Lb$, and $\lambda 2$ ranges from ¼ to ⅜.

8. The magnetic levitation gravity compensation device according to claim 1, wherein a spacing distance between the first permanent magnet and the second permanent magnet is Rg, and Rg is not smaller than ten times a spacing distance between the second permanent magnet and the end permanent magnet.

9. A workbench, comprising a workbench body, wherein a cavity is provided below the workbench body, and is configured for accommodating the magnetic levitation gravity compensation device according to claim 1.

10. The workbench according to claim 9, wherein a number of the cavities is three or four.

* * * * *